US008353466B2

(12) United States Patent
Hsieh et al.

(10) Patent No.: US 8,353,466 B2
(45) Date of Patent: Jan. 15, 2013

(54) ATOMIZATION STRUCTURE AND MANUFACTURING METHOD THEREOF

(75) Inventors: Shu-Pin Hsieh, Taoyuan Hsien (TW); Chien-Hua Lin, Taoyuan Hsien (TW); Tai-Shuan Lin, Taoyuan Hsien (TW); Chieh-Ming Hsiung, Taoyuan Hsien (TW); Chia-Chen Huang, Taoyuan Hsien (TW); Mei-Hui Huang, Taoyuan Hsien (TW); Liang-Wei Liu, Taoyuan Hsien (TW)

(73) Assignee: Micro Base Technology Corporation, Taoyuan Hsien (TW)

( * ) Notice: Subject to any disclaimer, the term of this patent is extended or adjusted under 35 U.S.C. 154(b) by 154 days.

(21) Appl. No.: 13/005,303

(22) Filed: Jan. 12, 2011

(65) Prior Publication Data

US 2011/0168805 A1 Jul. 14, 2011

(30) Foreign Application Priority Data

Jan. 13, 2010 (TW) ................................ 99200691 U

(51) Int. Cl.
*B05B 1/08* (2006.01)
*H01L 41/053* (2006.01)
*H01L 41/02* (2006.01)
*H01L 41/00* (2006.01)
*H02N 2/00* (2006.01)

(52) U.S. Cl. ...................... 239/102.2; 310/348; 310/354

(58) Field of Classification Search ........... 239/4, 102.1, 239/102.2, 288, 338; 310/311, 326, 340, 310/348, 354; 128/200.14, 200.16; 261/DIG. 48
See application file for complete search history.

(56) References Cited

U.S. PATENT DOCUMENTS

| | | | | |
|---|---|---|---|---|
| 5,803,362 | A * | 9/1998 | Fraccaroli | 239/102.2 |
| 5,996,903 | A * | 12/1999 | Asai et al. | 239/4 |
| 2003/0234298 | A1 * | 12/2003 | Chen | 239/102.2 |
| 2004/0069864 | A1 * | 4/2004 | Peng et al. | 239/102.2 |

* cited by examiner

*Primary Examiner* — Darren W Gorman
(74) *Attorney, Agent, or Firm* — WPAT, P.C.; Anthony King

(57) ABSTRACT

The present invention discloses an atomization structure comprising a carrier, a cover plate, a piezoelectric driving device and an atomization piece. The carrier includes at least one first support portion, the cover plate comprises at least one second support portion, and the carrier is covered by the plate covers. The piezoelectric driving device is disposed between the carrier and the cover plate, the atomization piece is clamped by one end of the piezoelectric driving device. The actuating effect of the piezoelectric driving device would not be absorbed but kept by point contacting the first support portions and the second support portions to clamp and support the piezoelectric driving device.

12 Claims, 5 Drawing Sheets

ATOMIZATION STRUCTURE AND MANUFACTURING METHOD THEREOF

FIELD OF THE INVENTION

The exemplary embodiment(s) of the present invention relates to a field of an atomization structure and a manufacturing method thereof. More specifically, the exemplary embodiment(s) of the present invention relates to improve the atomization performance of the atomization structure and a manufacturing method thereof without affect the actuation efficient of a piezoelectric driving device.

DESCRIPTION OF THE RELATED ART

The conventional atomization apparatus electrifies a piezoelectric driving device to perform high-frequency vibration according to the piezoelectric effect, and then a atomization piece disposed at one side of the piezoelectric driving device is drove to hit a liquid surface to atomize a the liquid.

In addition, the piezoelectric driving device of the conventional atomization apparatus is usually packaged with waterproof materials like rubber or silicone, and the piezoelectric driving device could be isolated from water vapor to avoid the heat and high temperature due to short circuit result in the silver paint on the surface of the piezoelectric driving device falling off, and prevent the piezoelectric driving device from breaking down.

However, the waterproof material like rubber or silicone would absorb the vibration and cause the drop of the atomization efficiency.

SUMMARY OF THE INVENTION

To solve the problems in the conventional arts, it is a primary object of the present invention to provide an atomization structure and a manufacturing method thereof to solve the problem that the waterproof material would affect the efficiency of the piezoelectric driving device.

To achieve the above object, an atomization structure according to the present invention includes a carrier, a cover plate, a piezoelectric driving device and an atomization piece. The carrier comprises a plurality of first support portions, and the cover plate comprises a plurality of second support portions. The cover plate is disposed on the carrier and defines an accommodating space with the carrier. The piezoelectric driving device is disposed in the accommodating space, and the atomization piece is clamped by one end of the piezoelectric driving device. The first support portions and the second support portions extend into the accommodating space, and the first support portions and the second support portions contact and fasten the piezoelectric driving device.

Wherein the first support portions are disposed on the periphery of the accommodating space with intervals.

Wherein the second support portions are disposed on the periphery of the accommodating space with intervals.

Wherein the carrier comprises a first adhesive surface, the cover plate comprises a second adhesive surface responding to the first adhesive surface Wherein the first adhesive surface and the second adhesive surface adhesive to each other to combine the carrier and the cover plate.

Wherein the carrier comprises a plurality of concave trenches disposed on the carrier with intervals.

Wherein the cover plate comprises a plurality of engaging portions disposed on the cover plate with intervals.

Wherein each of the engaging portions engages a corresponding one of the concave trenches.

To achieve another object, a manufacturing method of atomization structure according to the present invention includes the following steps of: providing a carrier having a first support portion; disposing a piezoelectric driving device on one side of the carrier, wherein a atomization piece is disposed on one end of the piezoelectric driving device; providing a cover plate; disposing a first adhesive surface on the carrier and a second adhesive surface on the cover plate, then assembling the carrier and the cover plate; baking the first adhesive surface and the second adhesive surface to glue the first adhesive surface and the second adhesive surface so as to bond the carrier and the cover plate.

Wherein the carrier comprises an extending portion, and the atomization piece is disposed on one side of the extending portion.

Wherein the carrier comprises a first isolating portion disposed on one side of the carrier.

Wherein the cover plate comprises a second isolating portion disposed on one side of the cover plate.

Wherein the atomization piece is disposed between the first isolating portion and the second isolating portion.

With the above arrangements, the atomization structure and a manufacturing method thereof according to the present invention utilize point contact between the first support portions disposed on the carrier and the second support portions disposed on the cover plate to limit the position of the piezoelectric driving device, so as to avoid the actuating efficiency being decreasing because of the vibration energy being absorbed by the waterproof material like rubber or silicone packaging outside the piezoelectric driving device.

With these and other objects, advantages, and features of the invention that may become hereinafter apparent, the nature of the invention may be more clearly understood by reference to the detailed description of the invention, the embodiments and to the several drawings herein.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PREFERRED EMBODIMENTS

Exemplary embodiments of the present invention are described herein in the context of an atomization structure and a manufacturing method thereof.

Those of ordinary skilled in the art will realize that the following detailed description of the exemplary embodiment (s) is illustrative only and is not intended to be in any way limiting. Other embodiments will readily suggest themselves to such skilled persons having the benefit of this disclosure. Reference will now be made in detail to implementations of the exemplary embodiment(s) as illustrated in the accompanying drawings. The same reference indicators will be used throughout the drawings and the following detailed description to refer to the same or like parts.

Figure 1:
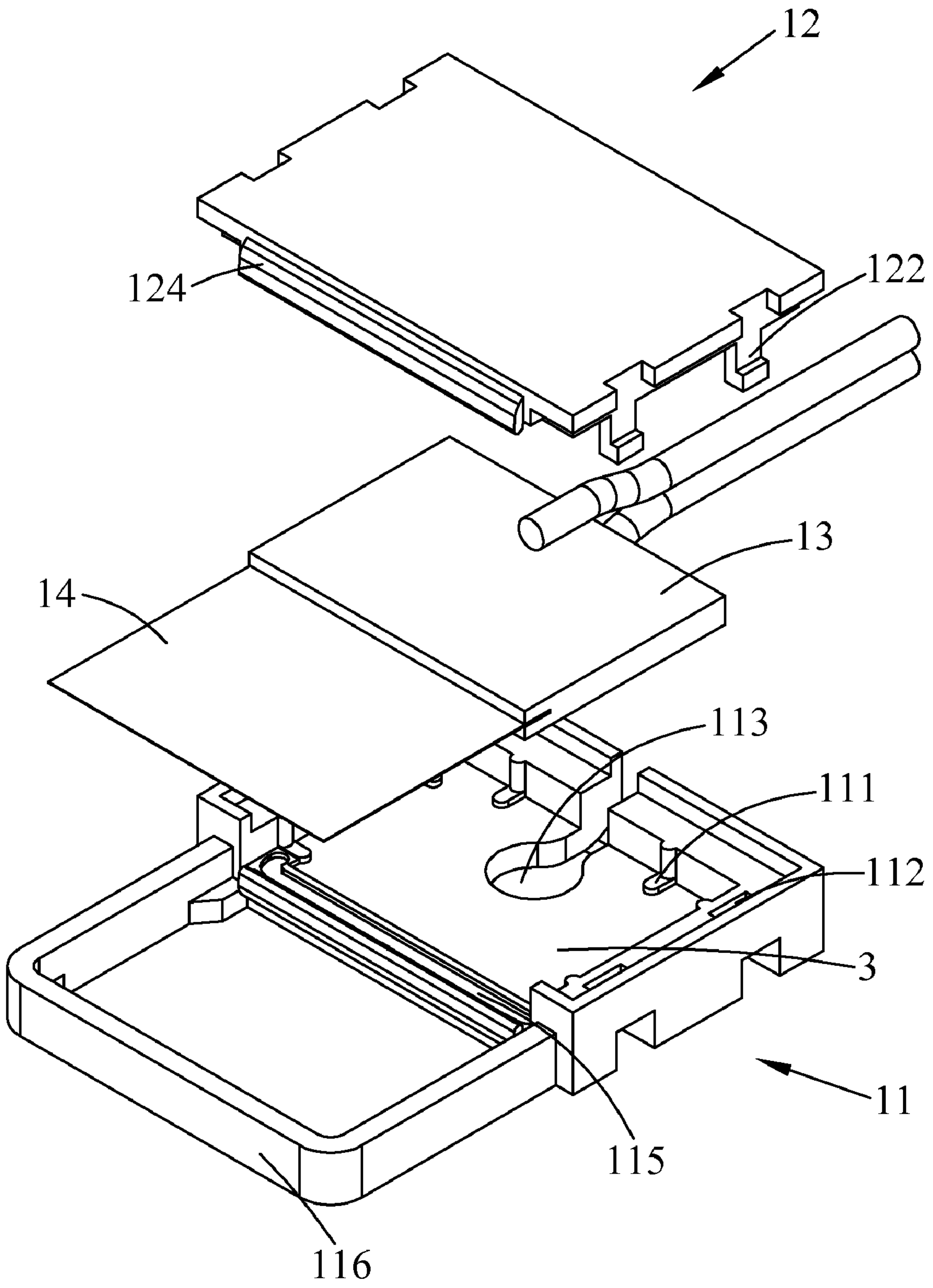
FIG. 1 illustrates a decomposition chart of an atomization structure in accordance with the present invention.
Figure 2:
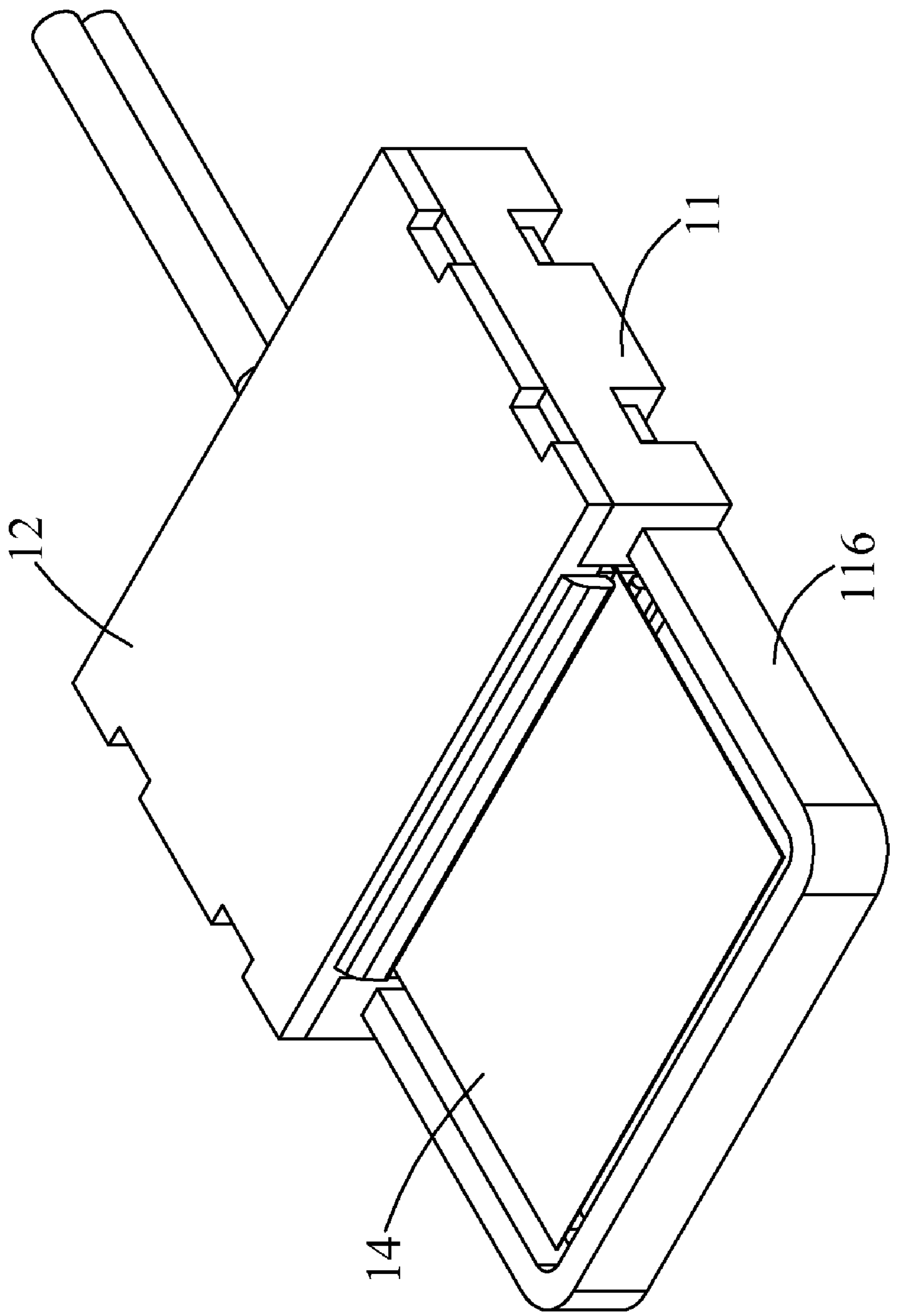
FIG. 2 illustrates an assembly drawing of an atomization structure in accordance with the present invention.

Please refer to FIG. 1 and FIG. 2 that are a decomposition chart and an assembly drawing of an atomization structure according to the present invention. In the figures, the atomization structure comprises a carrier 11, a cover plate 12, a piezoelectric driving device 13 and an atomization piece 14. The atomization structure is capable for micro-medicine atomizer, indoor deodorization apparatus and odour removal device for hospital environment, but dose not limit in these applicants.

Figure 3:
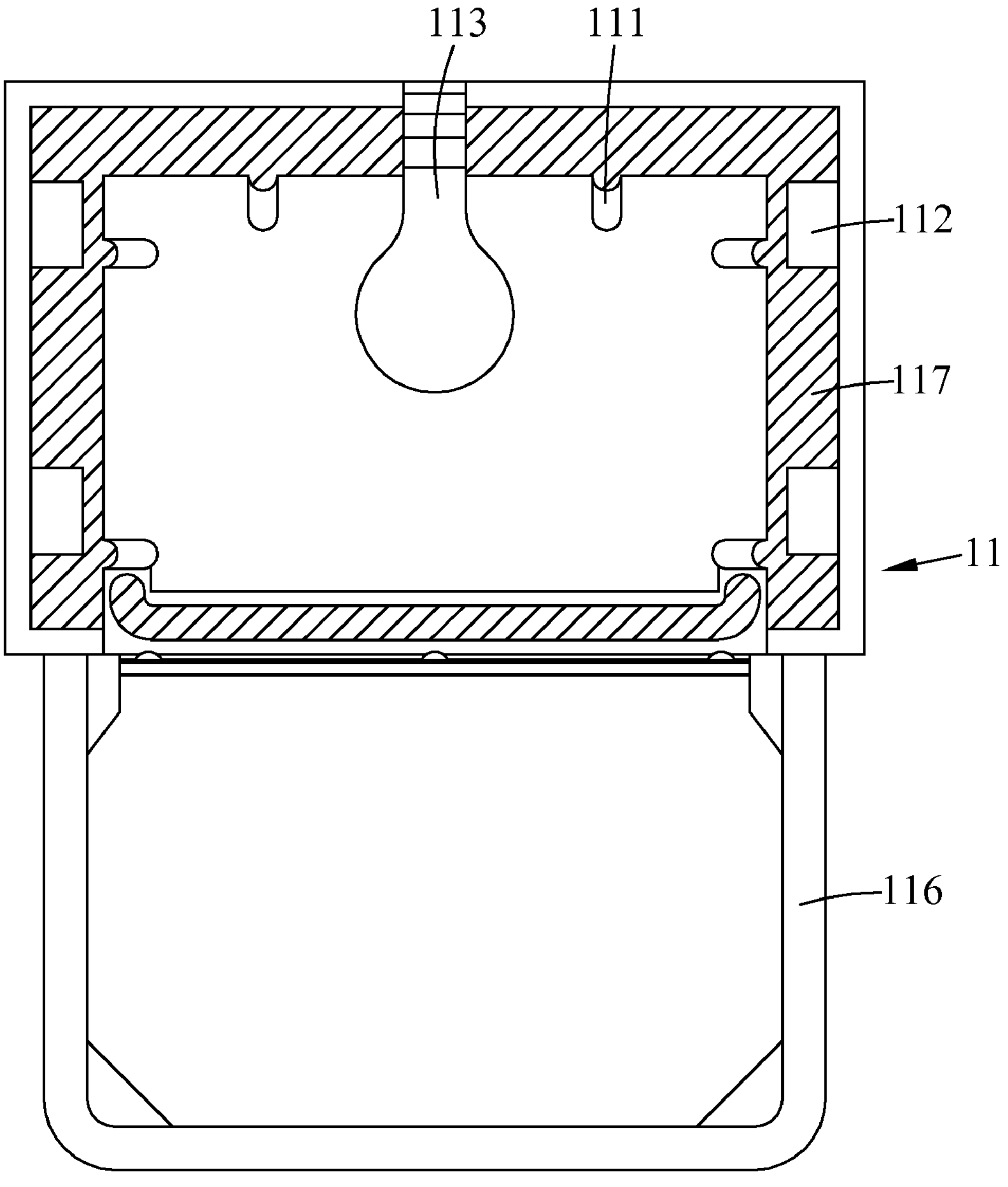
FIG. 3 illustrates a sectional view of a carrier of an atomization structure in accordance with the present invention.

Please continually refer to FIG. 3 that is a sectional view of a carrier of an atomization structure in accordance with the present invention. The carrier 11 could be made of a waterproof material, and the carrier 11 comprises a plurality of first support portions 111, a plurality of concave trenches 112 and a first receiving groove 113. The first support portion 111 could be a convex body and disposed on the carrier 11 with intervals, and the first support portion 111 has a function to isolate water. The concave trenches 112 are disposed both sides of the carrier 11. A wire is disposed through the first receiving groove 113, and the wire could transport electricity to the piezoelectric driving device 13 so as to transform the electric energy into mechanical vibration energy.

Figure 4:
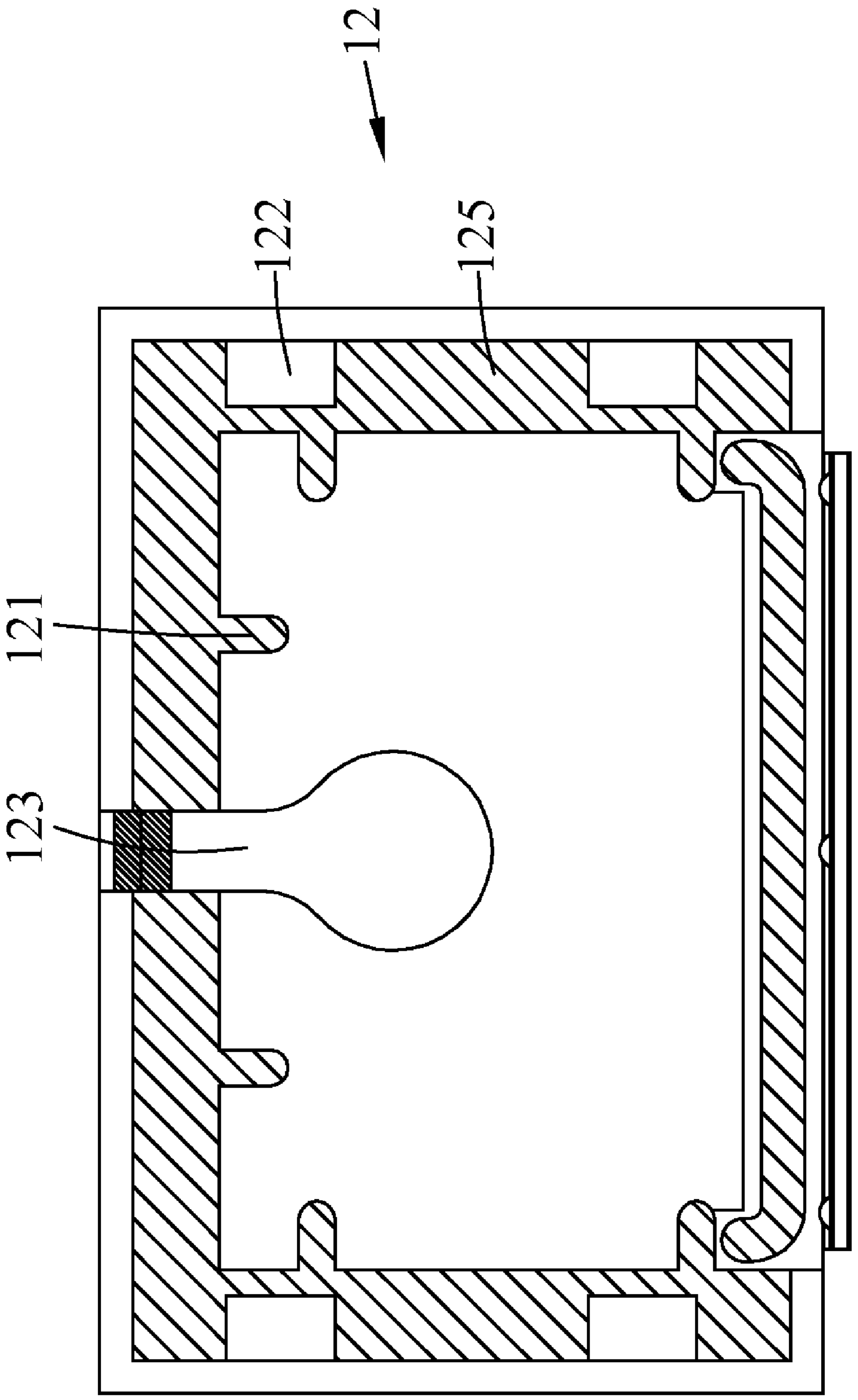
FIG. 4 illustrates a sectional view of a cover plate of an atomization structure in accordance with the present invention.

Please continually refer to FIG. 4 that is a sectional view of a cover plate of an atomization structure in accordance with the present invention. The cover plate 12 corresponding to the carrier 11 could be made of waterproof materials, and is disposed the on the carrier 11. The cover plate 12 includes a plurality of second support portions 121, a plurality of engaging portions 122 and a second receiving groove 123. The second support portions 121 could be a convex body and corresponding to the first support portions 111 disposed on the carrier 11 with intervals. The engaging portions 122 are disposed on both sides of the cover plate 12, and each of the engaging portions 122 engages one of the corresponding concave trenches 112. Wires could be disposed through the second receiving groove 123. When the carrier 11 is covered by the cover plate 12, an accommodating space 3 for disposing the piezoelectric driving device 13 is defined by the carrier 11 and the cover plate 12. The second support portions 121 could be installed with intervals on the periphery of the accommodating space 3, and extend into the accommodating space 3.

One side of the atomization piece 14 coated with an adhesive is clamped by one end of the piezoelectric driving device 13, and the atomization piece 14 is combined and fastened with the piezoelectric driving device 13 by the adhesive. In addition, a plurality of micro-pores (not shown in the figure) could be arranged on the surface of the atomization piece 14 to generate the atomization vapor. The aforementioned first support portions 111 and the second support portions 121 corresponding to the piezoelectric driving device 13 could contact and immobilize the piezoelectric driving device 13. The carrier 11 further includes a first isolating portion 115 and an extending potion 116 in order to improve the waterproof effect and protect the atomization piece 14. The cover plate 12 further includes a second isolating portion 124. The first isolating portion 115 is set on one side of the carrier 11 and corresponding to the atomization piece 14, and the first isolating portion 115 could be made of waterproof materials. The second isolating portion 124 is disposed on one side of the cover plate 12 and corresponding to the atomization piece 14, and the second isolating portion 124 could be made of waterproof materials. The extending portion 116 extends outward from one side of the carrier 11, and then surrounds the atomization piece 14 to protect the atomization piece 14 from being damaged by impact or other reasons.

Moreover, in order to tightly seal the carrier 11 and the cover plate 12, a first adhesive surface 117 could be coated on the carrier 11 before the packaging, and a second adhesive surface 125 could be coated on the cover 12 before the packaging. The second adhesive surface 125 could extend to the second support portions 121 to reinforce the fastening effect in the coating process. Besides, the first adhesive surface 117 and the second adhesive surface 125 could be made of polymers.

When assembling the atomization structure, first install the sealed piezoelectric driving device 13 and the atomization piece 14 into the carrier 11, and then cover the cover plate 12 on the carrier 11 with the engaging portions 122 and the concave trenches 112 engaging to each other so as to fix the cover plate 12 with the carrier 11. At this time, the first adhesive surface 117 and the second adhesive surface 125 are bonded with each other, and the atomization piece 14 is clamped between the first isolating portion 115 and the second isolating portion 124. The accommodating space 3 is sealed by the first isolating portion 115 and the second isolating portion 124 to avoid the penetration of vapor or liquid into the atomization structure. Next, in order to bond and fix the first adhesive surface 117 and the second adhesive surface 125 quickly so as to seal the carrier 11 and the cover plate 12, the atomization structure could be put into a backing apparatus (not shown in the figure) and baked at an appropriate temperature. The first adhesive surface 117 and the second adhesive surface 125 will be baked to dry and glue to each other, so as to complete the assembling of the atomization structure. The atomization structure could be avoided the penetration of the working liquid by baking the first adhesive surface 117 and the second adhesive surface 125 to dry and gluing to each other.

The piezoelectric driving device 13 is merely contacted and fixed by the first support portions 111 and the second portions 121 to avoid giving the piezoelectric driving device 13 too much suppress during the packaging process so lowering the piezoelectric driving ability to affect the atomization ability of the atomization apparatus.

Figure 5:
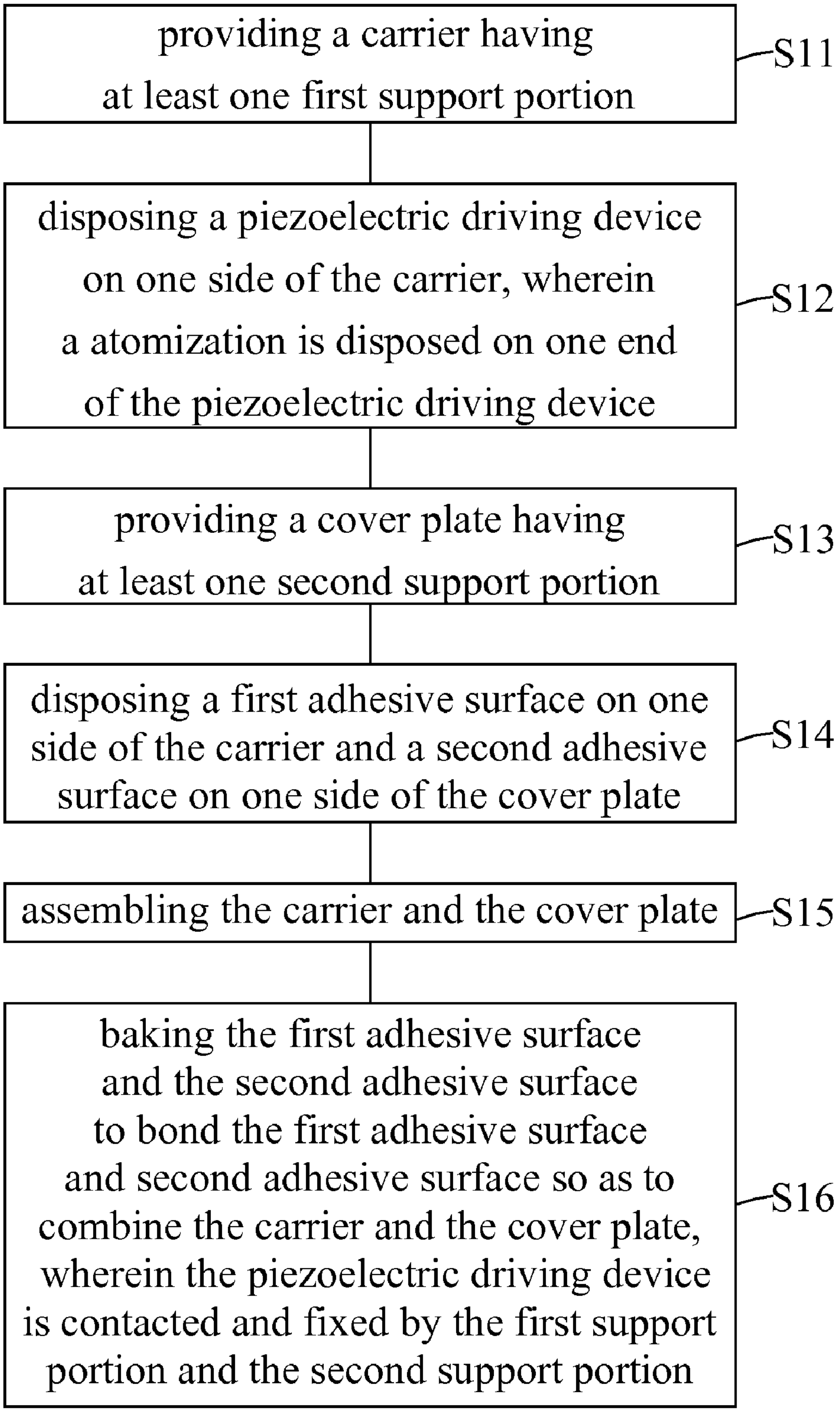
FIG. 5 illustrates a flow chart of a manufacturing method of an atomization structure in accordance with the present invention.

Please refer to FIG. 5 that is a flow chart of a manufacturing method of an atomization structure in accordance with the present invention. In the figure, the manufacturing method of an atomization structure comprises the follow steps of: (S11) providing a carrier having at least one first support portion; (S12) disposing a piezoelectric driving device on one side of the carrier, wherein a atomization is disposed on one end of the piezoelectric driving device; (S13) providing a cover plate having at least one second support portion; (S14) disposing a first adhesive surface on one side of the carrier and a second adhesive surface on one side of the cover plate; (S15) assembling the carrier and the cover plate; (S16) baking the first adhesive surface and the second adhesive surface to bond the first adhesive surface and second adhesive surface so as to combine the carrier and the cover plate, wherein the piezoelectric driving device is contacted and fixed by the first support portion and the second support portion.

The first adhesive surface and the second adhesive surface could be made of polymers.

The present invention has been described with some preferred embodiments thereof and it is understood that many changes and modifications in the described embodiments can be carried out without departing from the scope and the spirit of the invention that is intended to be limited only by the appended claims.

With the above arrangements, the atomization structure according to the present invention has an effect that increases the vibration range of the piezoelectric driving device to raise the atomization amount of the atomization structure due to greatly lower the suppress to the motion ability of the piezoelectric driving device by packaging the first support portions, the second support portions and the piezoelectric driving device with specifically small contact area.

The atomization structure according to the present invention has another effect that avoids the penetration of the working liquid into the atomization structure due to tightly bonding the carrier and the cover plate via the first adhesive surface and the second adhesive surface by backing the first adhesive surface and the second adhesive surface.

While particular embodiments of the present invention have been shown and described, it will be obvious to those skilled in the art that, based upon the teachings herein, changes and modifications may be made without departing from this invention and its broader aspects. Therefore, the appended claims are intended to encompass within their scope of all such changes and modifications as are within the true spirit and scope of the exemplary embodiment(s) of the present invention.

What is claimed is:

1. An atomization structure, comprising:

a carrier having a plurality of first support portions;

a cover plate having a plurality of second support portions, the cover plate covering the carrier and defining an accommodating space with the carrier;

a piezoelectric driving device disposed in the accommodating space; and an atomization piece clamped by one end of the piezoelectric driving device;

wherein the first support portions extend into the accommodating space, the second support portions extend into the accommodating space, and the piezoelectric driving device is contacted and fixed by the first support portions and the second support portions;

wherein the carrier further comprises a first isolating portion, the cover plate further comprises a second isolating portion, and the atomization piece is clamped by the first isolating portion and the second isolating portion so as to seal the accommodating space.

2. The atomization structure as claim 1, wherein the first support portions are disposed on the periphery of the accommodating space with intervals.

3. The atomization structure as claim 1, wherein the second support portions are disposed on the periphery of the accommodating space with intervals.

4. The atomization structure as claim 1, wherein the first support portions are disposed at a position of the bottom periphery of the accommodating space of the carrier and extended into the accommodating space, the second support portions are disposed at a position of the periphery of the accommodating space of the cover plate and extended into the accommodating space.

5. The atomization structure as claim 1, wherein the carrier comprises a first adhesive surface, the cover plate comprises a second adhesive surface, and the first adhesive surface is corresponding to the second adhesive surface.

6. The atomization structure as claim 5, wherein the first adhesive surface is made of polymers.

7. The atomization structure as claim 5, wherein the second adhesive surface is made of polymers.

8. The atomization structure as claim 5, wherein the first adhesive surface and the second adhesive surface glue to each other so as to bond the carrier and the cover plate.

9. The atomization structure as claim 1, wherein the carrier comprises a plurality of concave trenches disposed on the carrier with intervals.

10. The atomization structure as claim 9, wherein the cover plate comprises a plurality of engaging portions disposed on the cover plate with intervals.

11. The atomization structure as claim 10, wherein each of the engaging portions engages a corresponding one of the concave trenches.

12. The atomization structure as claim 1, wherein the carrier comprises an extending portion to protect the atomization piece, and the atomization piece is disposed on one side of the extending portion.

* * * * *